United States Patent
Rotondaro et al.

(10) Patent No.: US 6,858,908 B2
(45) Date of Patent: Feb. 22, 2005

(54) COMPLEMENTARY TRANSISTORS HAVING RESPECTIVE GATES FORMED FROM A METAL AND A CORRESPONDING METAL-SILICIDE

(75) Inventors: Antonio L. P. Rotondaro, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/640,458

(22) Filed: Aug. 13, 2003

(65) Prior Publication Data

US 2004/0033669 A1 Feb. 19, 2004

Related U.S. Application Data

(62) Division of application No. 09/998,068, filed on Nov. 30, 2001, now Pat. No. 6,642,094.

(51) Int. Cl.$^7$ ............................................... H01L 29/76
(52) U.S. Cl. ...................... 257/412; 257/364; 257/365; 257/366; 257/388; 257/407; 257/763
(58) Field of Search ................................ 257/763, 384, 257/364, 365, 366, 388, 407, 412

(56) References Cited

U.S. PATENT DOCUMENTS

| | | | | |
|---|---|---|---|---|
| 5,162,884 A | * | 11/1992 | Liou et al. | |
| 5,241,193 A | * | 8/1993 | Pfiester et al. | |
| 5,572,047 A | * | 11/1996 | Hiroki et al. | |
| 6,027,961 A | * | 2/2000 | Maiti et al. | |
| 6,087,236 A | * | 7/2000 | Chau et al. | |
| 6,365,445 B1 | * | 4/2002 | Yu | |
| 6,475,908 B1 | * | 11/2002 | Lin et al. | |
| 6,506,642 B1 | * | 1/2003 | Luning et al. | |
| 6,586,321 B2 | * | 7/2003 | Tai | ............................. 438/592 |

* cited by examiner

*Primary Examiner*—Richard Elms
*Assistant Examiner*—Douglas Menz
(74) *Attorney, Agent, or Firm*—Peter K. McLarty; W. James Brady, III; Frederick J. Telecky, Jr.

(57) ABSTRACT

A method of forming a first and second transistor. The method provides a semiconductor surface (20). The method also forms a gate dielectric (30) adjacent the semiconductor surface. Further, the method forms a first transistor gate electrode (90$_2$) comprising a metal portion (40$_2$) in a fixed relationship with respect to the gate dielectric. Still further, the method forms a second transistor gate electrode (90$_1$) comprising a silicide (70$_1$) of the metal portion in a fixed relationship with respect to the gate dielectric.

8 Claims, 2 Drawing Sheets

COMPLEMENTARY TRANSISTORS HAVING RESPECTIVE GATES FORMED FROM A METAL AND A CORRESPONDING METAL-SILICIDE

This application is a divisional of application Ser. No. 09/998,068, filed Nov. 30, 2001 now U.S. Pat. No. 6,642,094.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to semiconductor transistor fabrication and are more particularly directed to complementary transistors.

Integrated circuit technology continues to advance at a rapid pace, with many circuit technologies being implemented using semiconductor fabrication processes. With the advancement of semiconductor circuit fabrication, consideration is given to various aspects, including maximizing efficiency, lowering manufacturing cost, and increasing performance. With these goals in mind, one area relating to the preferred embodiments is the continuing trend of reducing the thickness of the transistor gate dielectrics. For example, in the past the gate dielectric layer thickness was on the order of 100 Angstroms, but more recently that thickness has reduced considerably with a more current goal being on the order of 20 Angstroms. Indeed, this goal will strive for even thinner gate dielectric layers in the foreseeable future. This goal reduces device size and facilitates improved device performance.

While the above demonstrates the desirability and trend toward thinner gate dielectrics, such an approach also provides a considerable drawback. Specifically, overlying the thin gate dielectric is a polycrystalline silicon ("polysilicon") gate layer, and it is known in the art that polysilicon naturally includes a depletion region at the interface between the polysilicon gate and the gate dielectric. Typically, the depletion region manifests itself as providing the electrical equivalent of approximately a 3 Angstrom thick insulator and, as such, the region in effect provides an insulating effect rather than a conducting effect as would be present in the remainder of the polysilicon gate conductor. Using the preceding numeric example, therefore, for a 100 Angstrom thick gate dielectric, then the overlying effective 3 Angstrom thick polysilicon depletion region may be thought to effectively increase the overall insulation between the gate and the underlying transistor channel from 100 Angstroms to 103 Angstroms, that is, the effect of the depletion region affects the insulating thickness by three percent—as such, for previous thicker gate insulators the effect of the polysilicon depletion region may be considered to have a negligible impact on the gate dielectric. In contrast, however, for a 20 Angstrom thick gate dielectric, then the polysilicon gate conductor depletion region may be thought to increase the gate insulator to 23 Angstroms, thereby representing an increase on the order of 15 percent. This increased percentage significantly reduces the benefits otherwise provided by the thinner gate dielectric.

By way of further background, one approach in general to avoiding the depletion region phenomenon of polysilicon transistor gates is to use metal as an alternative material for the transistor gate since metal does not present a considerable depletion region, if any. Prior to the more recent use of polysilicon gates, metal gates were fairly common. The present inventors note, however, a previously identified drawback of such metal gates, which indeed led to the avoidance of such metals in contemporary devices. Specifically, each metal has a corresponding so-called work function, and in the transistor art each transistor also has a corresponding preferred value for a work function of the gate electrode. However, the desired work function value differs for different transistor types. For example, based on present day threshold voltage channel doping, a p-channel MOS transistor ("PMOS") is optimized when the gate electrode has a work function on the order of 5 eV while an n-channel MOS transistor ("NMOS") is optimized when the gate electrode has a work function on the order of 4 eV. The problem with previously-used metal gates arose with the development of CMOS circuits which, by definition, include both PMOS and NMOS transistors. Specifically, because a metal gate provides only a single work function, then it could not be selected to provide the two different desired work functions of the PMOS and NMOS devices. Instead, at best a metal could be selected to be between the desired work function of a PMOS and an NMOS transistor, which is sometimes referred to as the "midgap" between these devices (i.e., on the order of 4.5 eV for the preceding examples). This inability to match different work functions led to the use of polysilicon gates whereby the polysilicon gates of the NMOS devices could be doped in a first manner in view of the desired work function for NMOS transistors and the polysilicon gates of the PMOS devices could be doped in a second manner in view of the desired work function for PMOS transistors.

In view of the above, there arises a need to address the limitations and drawbacks of the prior art, as is achieved by the preferred embodiments described below.

BRIEF SUMMARY OF THE INVENTION

In the preferred embodiment, there is a method of forming a first and second transistor. The method provides a semiconductor surface. The method also forms a gate dielectric adjacent the semiconductor surface. Further, the method forms a first transistor gate electrode comprising a metal portion in a fixed relationship with respect to the gate dielectric. Still further, the method forms a second transistor gate electrode comprising a silicide of the metal portion in a fixed relationship with respect to the gate dielectric. Other aspects are also disclosed and claimed.

DETAILED DESCRIPTION OF THE INVENTION

Figure 1:
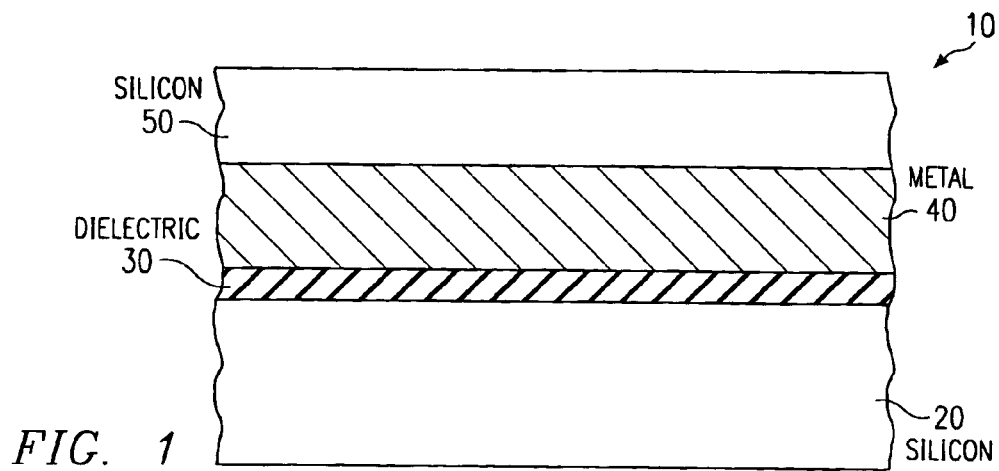
FIG. 1 illustrates a cross-sectional view of a semiconductor structure according to the preferred embodiment after a first set of fabrication steps.

FIG. 1 illustrates a cross-sectional view of a semiconductor structure shown generally at 10. By way of introduction, structure 10 represents a first set of steps in accordance with the preferred embodiment, with the following discussion and additional Figures illustrating various additional steps used to form complementary PMOS and NMOS transistors. Moreover, while the set of transistors ultimately illustrate depict only a single PMOS and a single NMOS transistor, one skilled in the art will readily appreciate that the present inventive teachings may apply to numerous transistors of both types in a circuit. Also by way of introduction, note that the various layers shown in the cross-section of FIG. 1 and later Figures are not shown to scale to simplify the following discussion and because varying thickness may be employed as may be ascertained by one skilled in the art and also in view of various guidance given below.

Turning to FIG. 1 in greater detail, the preferred embodiment includes a semiconductor surface formed preferably by a substrate 20, where substrate 20 is preferably formed from silicon. A dielectric layer 30 is formed over substrate 20, where the material for dielectric layer 30 is preferably chosen so that portions of dielectric layer 30 later function as gate dielectrics for complementary PMOS and NMOS transistors. A metal layer 40 is formed over dielectric layer 30, where in the preferred embodiment metal layer 40 is formed from cobalt. Finally, a silicon layer 50 is formed over metal layer 40. In the preferred embodiment, silicon layer 50 may be polysilicon or amorphous silicon. As between these alternatives, preferably the selection is such that, at the stage in the process represented by FIG. 1, the chosen silicon in layer 50 does not react with the underlying metal layer 40. Given this consideration, in most applications amorphous silicon is more preferred because it may be formed over metal layer 40 at lower temperatures than that typically required to form polysilicon. For example, an amorphous silicon layer 50 may be formed at temperatures lower than 500° C. Note also that the manner in which silicon layer 50 is formed may be according to various alternatives, again where the choice of such an alternative is preferably directed to ensuring no reaction between silicon layer 50 and metal layer 40. For example, a sputter technique may be used because it may be carried out at low temperatures such as room temperature, although from a manufacturing standpoint such a technique may prove relatively complex. As an alternative, a plasma-enhanced chemical vapor deposition ("CVD") may be used because it too uses a relatively low temperature, where this temperature may be above room temperature yet the CVD may prove more easily implemented as compared to the sputter technique. Lastly, a thermal CVD process may be used, but caution should be taken to ensure that any temperature constraint of that process does not cause a reaction between metal layer 40 and silicon layer 50.

Figure 2:
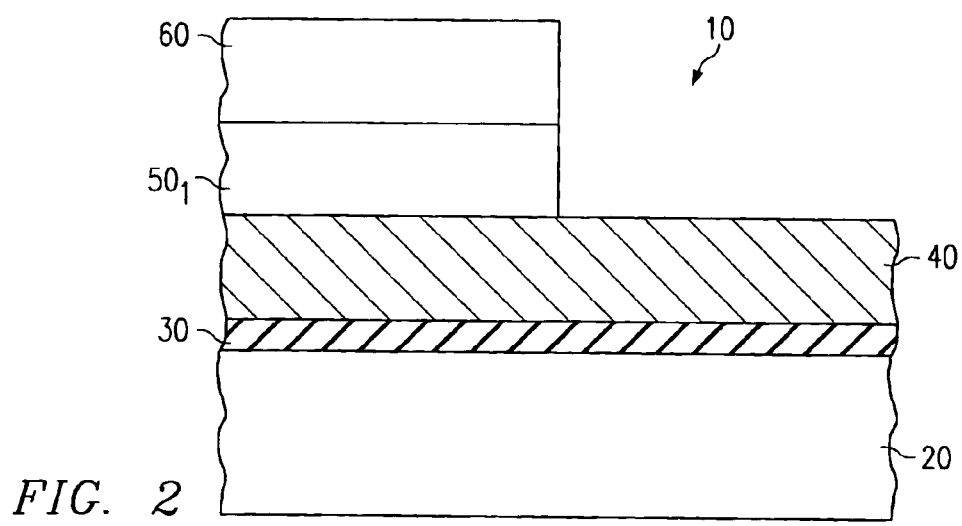
FIG. 2 illustrates a cross-sectional view of the structure from FIG. 1 after additional processing steps.

FIG. 2 illustrates a cross-sectional view of structure 10 from FIG. 1 after additional processing steps. In FIG. 2, a portion of silicon layer 50 is removed, thereby leaving a remaining portion $50_1$ of silicon. In the preferred embodiment, this selective removal is achieved by first forming a photoresist layer over silicon layer 50 and then patterning that photoresist layer to leave a photoresist portion 60 of the photoresist layer as shown in FIG. 2. Thereafter, an etch selective to the metal of metal layer 40 is performed, that is, one which stops when it reaches metal layer 40. In the preferred embodiment, therefore, the silicon etch performed in connection with FIG. 2 is selective to cobalt. The selective etch removes the area of silicon layer 50 that is not covered by photoresist portion 60, thereby leaving a remaining silicon portion $50_1$ under photoresist portion 60. In the preferred embodiment the silicon etch is a dry process, although alternatively a wet etch may be implemented because the result of the etch does not provide critical dimensions in that a later etch is performed to provide various device boundaries as further appreciated below.

Figure 3:
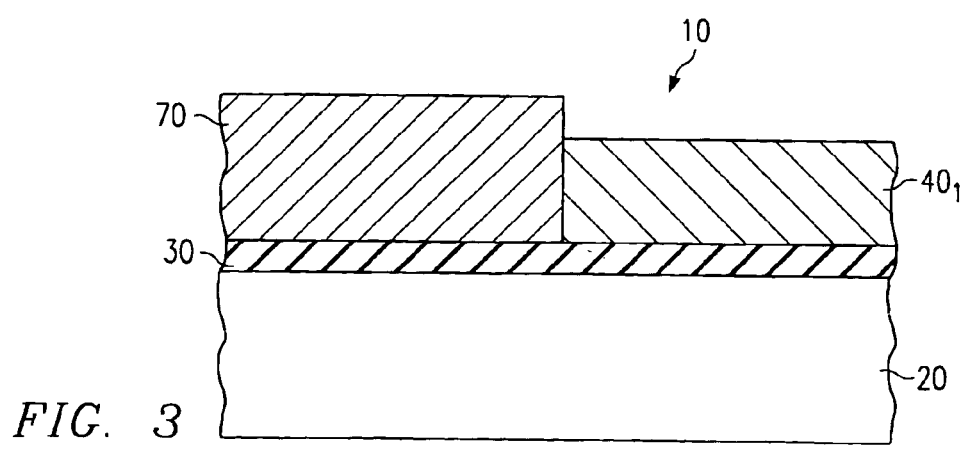
FIG. 3 illustrates a cross-sectional view of the structure from FIG. 2 after additional processing steps.

FIG. 3 illustrates a cross-sectional view of structure 10 from FIG. 2 after two additional processing steps, and each of these steps is discussed below.

As a first step reflected in FIG. 3, photoresist portion 60 (see FIG. 2) is removed, and this removal step may be accomplished in various manners. For example, either an oxygen or hydrogen ash may be used, although an oxygen approach is less favored because it may pose a risk of oxidation of the metal (e.g., cobalt) in the exposed area of metal layer 40. As still another example, a solvent may be chosen, in which case the particular solvent should be selected so as not to damage either the silicon in portion $50_1$ underlying photoresist portion 60 or the metal in the exposed area of metal layer 40. In any event, once photoresist portion 60 is removed, silicon portion $50_1$ is exposed.

As a second step reflected in FIG. 3, an anneal step is performed preferably after photoresist portion 60 is removed. The anneal step may be achieved using various temperatures and times, and by way of example a rapid thermal processing ("RTP") operation may be used whereby a relatively short anneal is performed at temperatures of 500° C. or greater. In the preferred embodiment, the anneal causes silicon portion $50_1$ to react with the aligned portion of the metal underlying it in metal layer 40, and this reaction thereby forms a metal silicide portion 70. The actual temperature used in the anneal step may determine the precise type of silicide in silicide portion 70. For example, at temperatures on the order of 500 to 600° C. and using the preferred metal of cobalt for metal layer 40, then silicide portion 70 is likely to form a cobalt monosilicide. As another example, at temperatures on the order of 700 to 800° C. and again using the preferred metal of cobalt for metal layer 40, then silicide portion 70 is likely to form a cobalt disilicide. Indeed, in various applications, the cobalt disilicide result may be desirable because it has a lower resistivity as compared to cobalt monosilicide. In addition, note also from FIG. 2 and the result in FIG. 3 that the thickness of silicon layer 50, which determines the thickness of silicon portion $50_1$, also may affect the extent to which the metal in metal layer 40 is converted to a silicide. Further in this regard, in an alternative method approach, the thickness of silicon layer 50 may be selected so as to achieve a desired extent and thickness of silicide in silicide portion 70. However, thickness control may prove difficult, but in view of this added complexity still another approach within the inventive scope is to choose the thickness of silicon layer 50 to be considerably large with the goal that not all of the silicon will be consumed during the anneal step. Using this approach, then after the anneal a portion of structure 10 is etched, such as through use of a blanket silicon etch, so as to remove the unconsumed silicon. With the unconsumed silicon removed, silicide portion 70 remains as shown in FIG. 3. Lastly, note that the preferred anneal step does not materially affect a portion $40_1$ of metal layer 40 to the right of FIG. 3 because it was not in contact with any silicon as shown in FIG. 2. Thus, portion $40_1$ remains as the material originally used for metal layer 40 (e.g., cobalt).

Figure 4A:
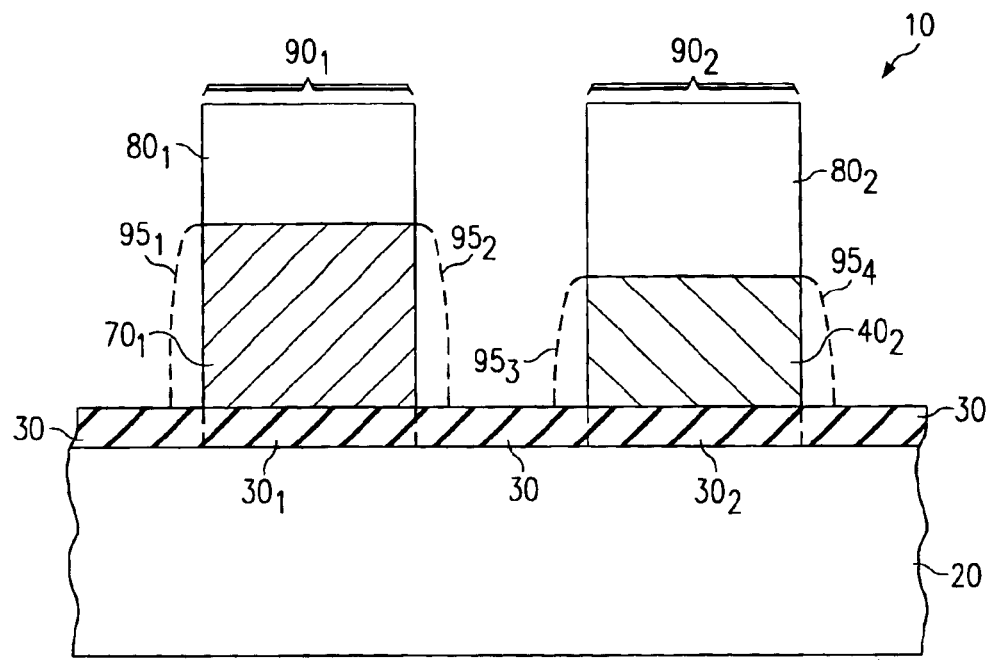
FIG. 4a illustrates a cross-sectional view of the structure from FIG. 3 after additional processing steps.

FIG. 4a illustrates a cross-sectional view of structure 10 from FIG. 3 after additional processing steps. First, a photoresist layer is formed and patterned over structure 10 to thereby form two photoresist portions $80_1$ and $80_2$ overlying the metal silicide and metal materials, respectively, underlying those portions. Second, an etch is performed down to dielectric layer 30. The resulting structures following this etch are therefore shown in FIG. 4a and include two gate electrodes $90_1$ and $90_2$. With respect to gate electrode $90_1$, it includes a silicide portion $70_1$ which remains from the etch of silicide layer 70, and a portion of dielectric layer 30 separates silicide portion $70_1$ from substrate 20 and, thus, this portion serves as a gate insulator $30_1$. With respect to gate electrode $90_2$, it includes a metal portion $40_2$ which remains from the etch of metal portion $40_1$, and a portion of dielectric layer 30 separates metal portion $40_2$ from substrate 20 and, thus, this portion serves as a gate insulator $30_2$.

Various additional observations now may be made with respect to the resulting structure in FIG. 4a. As a first observation, gate electrodes $90_1$ and $90_2$ provide structures from which two different transistors may be formed, where the gate of each respective transistor has a different work function because each electrode includes a different material. For example, an NMOS transistor may be formed with respect to gate electrode $90_1$ which thereby implements a gate having the work function of the metal silicide of silicide portion $70_1$, while a PMOS transistor may be formed with respect to electrode $90_2$ which thereby implements a gate having the work function of the metal of metal portion $40_2$. To further illustrate these aspects and as a second observation, photoresist portions $80_1$ and $80_2$ may be thereafter removed and insulating sidewalls may be formed with respect to the gate materials and their underlying gate insulators; such sidewalls $95_1$ through $95_4$ are shown with dashed lines in FIG. 4a. Additionally, various additional transistor aspects as readily ascertainable by one skilled in the art are not shown, but may be implemented with respect to the gate electrodes, including but not limited to n-wells or p-wells, source/drain regions, channel implants, isolation oxides, and the like. Moreover, some of these regions may be formed prior to the formation of the gate electrodes, such as the formation of isolation regions to later define boundaries for source/drain implants and a well of a given conductivity type such as an n-well for a PMOS transistor, while others of these regions may be formed after the formation of the gate electrodes, such as the formation of the source/drain regions. As a final observation, the preferred methodology as illustrated in FIGS. 1 through 4a demonstrates still another benefit arising with respect to the formation of gate insulators $30_1$ and $30_2$. Specifically, from the above, note that the etch down to dielectric layer 30 does not reach those portions of that layer that serve as gate insulators $30_1$ and $30_2$. Thus, the material properties of these gate insulators $30_1$ and $30_2$ are not affected by a direct exposure of these regions to the etch chemistry.

Figure 4B:
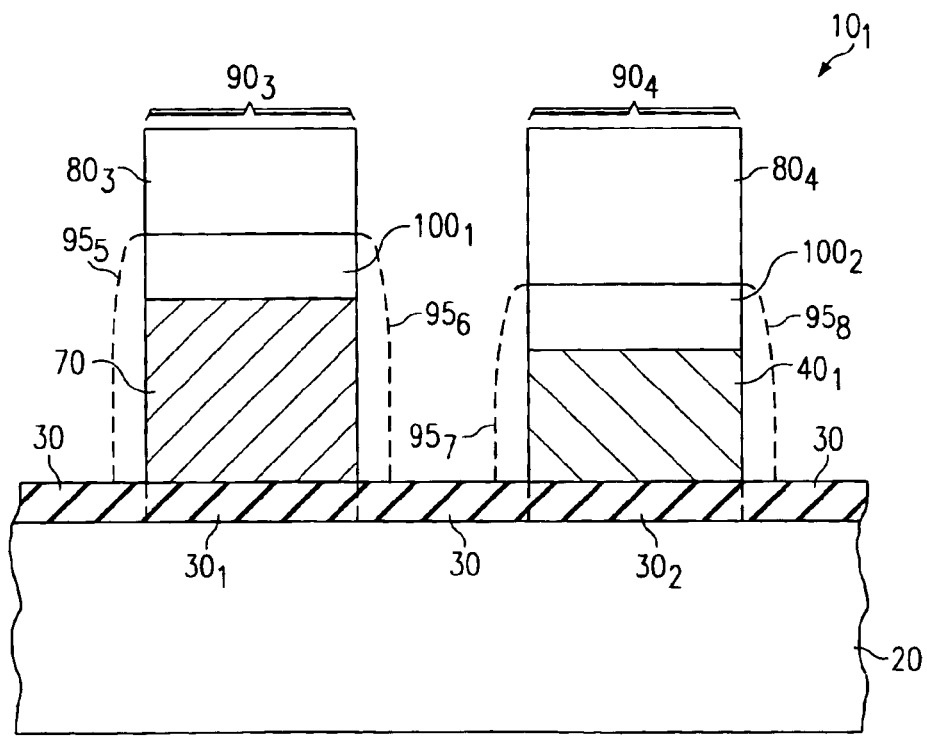
FIG. 4b illustrates a cross-sectional view of the structure from FIG. 3 after an alternative set of additional processing steps.

FIG. 4b illustrates a cross-sectional view of an alternative structure 10' which is created with alternative processing steps following FIG. 3. Structure 10' shares various attributes with structure 10 of FIG. 4a and, thus, like reference numerals are used in FIG. 4b with respect to these attributes. As an alteration, however, prior to forming a photoresist layer and photoresist portions $80_3$ and $80_4$ from that layer, an additional clad layer is formed, and photoresist portions $80_3$ and $80_4$ are then formed and an etch down to dielectric layer 30 is performed; as a result, two gate electrodes $90_3$ and $90_4$ are formed, but each gate electrode includes an additional clad layer portion $100_1$ and $100_2$, respectively. The inclusion of the additional clad layer and the resulting portions $100_1$ and $100_2$ may be used for various purposes. For example, if the approach of FIG. 4a would result in gate electrodes of an insufficient thickness, then the use of an additional clad layer to form portions $100_1$ and $100_2$ thereby increases the height of gate electrodes $90_3$ and $90_4$ as opposed to gate electrodes $90_1$ and $90_2$. As another example, if a lower sheet resistance is desired than that achieved by the approach of FIG. 4a, then the FIG. 4b approach may be implemented where the material for the clad layer forming portions $100_1$ and $100_2$ is selected to alter the sheet resistance. For example, various materials may be considered to reduce the overall sheet resistance of portions $100_1$ and $100_2$, such as various conductive layers including metals, and indeed preferably refractory metals, such as tungsten, tantalum, titanium, tungsten nitride, tantalum nitride, and titanium nitride, and also others as may be ascertained by one skilled in the art. In any event, once the etch to form gate electrodes $90_3$ and $90_4$ is complete, photoresist portions $80_1$ and $80_2$ may be removed and insulating sidewalls $95_5$ through $95_8$ may be formed, as shown with dashed lines in FIG. 4b. Lastly, various other benefits realized by structure 10 of FIG. 4a are also realized by structure 10' of FIG. 4b.

From the above, it may be appreciated that the above embodiments provide a set of transistor gates where one gate is formed from a metal and the other gate is formed from a corresponding metal-silicide. In the preferred embodiment, the metal is cobalt while the metal-silicide is either cobalt monosilicide or cobalt disilicide. Given these resulting structures, the preferred embodiment produces various benefits. For example, each transistor gate has a different work function, and indeed the metal gate structure proves useful as a PMOS gate electrode while the metal-silicide gate structure proves useful as an NMOS gate electrode. As another example, transistors may be formed using these resulting structures along with relatively thin gate dielectrics, and the overlying metal or metal-silicide gate will not include a substantial depletion region as is the case for contemporary polysilicon gate transistors. As still another example, while cobalt has been shown as a preferred metal, other metals may be used. As yet another example, the preferred embodiment contemplates additional variations described above. Thus, all of these examples further demonstrate that while the present embodiments have been described in detail, various substitutions, modifications or alterations could be made to the descriptions set forth above without departing from the inventive scope which is defined by the following claims.

What is claimed is:

1. An integrated circuit comprising a plurality of transistors including a first and second transistor, the integrated circuit comprising:

a semiconductor surface;

a gate dielectric adjacent the semiconductor surface;

a first transistor gate electrode comprising a metal portion in a fixed relationship with respect to the gate dielectric wherein the first transistor gate electrode further comprises a first clad conductor portion in a fixed relationship with respect to the metal portion;

a second transistor gate electrode comprising a suicide of the metal portion in a fixed relationship with respect to the gate dielectric wherein the second transistor gate electrode further comprises a second clad conductor portion in a fixed relationship with respect to the silicide of the metal portion;

first sidewalls adjacent said metal portion and said first clad conductor portion of said first gate electrode; and second sidewalls adjacent said silicide of said metal portion and said second clad conductor portion of said second gate electrode.

2. The integrated circuit of claim 1 wherein the metal portion comprises cobalt.

3. The integrated circuit of claim 2 wherein the silicide of the metal portion comprises cobalt monosilicide.

4. The integrated circuit of claim 2 wherein the silicide of the metal portion comprises cobalt disilicide.

5. The integrated circuit of claim 1 wherein the first clad portion and the second clad portion comprise metals.

6. The integrated circuit of claim 1 wherein the first clad portion and the second clad portion comprise a material selected from the group consisting of tantalum, titanium, and tungsten.

7. The integrated circuit of claim 1 wherein the first clad portion and the second clad portion comprise a material selected from the group consisting of tantalum nitride, titanium nitride, and tungsten nitride.

8. The integrated circuit of claim 1 and further comprising:
   a first source/drain region and a second source/drain region in a fixed relationship to the first transistor gate electrode; and
   a first source/drain region and a second source/drain region in a fixed relationship to the second transistor gate electrode.

* * * * *